(12) United States Patent
Benwadih

(10) Patent No.: US 9,057,651 B2
(45) Date of Patent: Jun. 16, 2015

(54) DEVICE FORMING A PRESSURE SENSOR, METHOD FOR PRODUCING SUCH A SENSOR AND APPLICATION IN THE PRODUCTION OF A TOUCH SCREEN

(75) Inventor: Mohamed Benwadih, Champigny sur Marne (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 273 days.

(21) Appl. No.: 13/639,472

(22) PCT Filed: Apr. 7, 2011

(86) PCT No.: PCT/EP2011/055435
§ 371 (c)(1),
(2), (4) Date: Dec. 17, 2012

(87) PCT Pub. No.: WO2011/124647
PCT Pub. Date: Oct. 13, 2011

(65) Prior Publication Data
US 2013/0112012 A1    May 9, 2013

(30) Foreign Application Priority Data
Apr. 8, 2010  (FR) ...................................... 10 52658

(51) Int. Cl.
*G01L 1/02* (2006.01)
*G06F 3/044* (2006.01)
(Continued)

(52) U.S. Cl.
CPC ... *G01L 1/02* (2013.01); *G01L 9/12* (2013.01); *G01L 9/0092* (2013.01);
(Continued)

(58) Field of Classification Search
CPC ....... G01L 9/0072; G01L 9/12; G01L 9/0005; G01L 1/142
USPC ........................................... 73/723–724, 718
See application file for complete search history.

(56) References Cited

U.S. PATENT DOCUMENTS 3,903,389 A    9/1975  Faustini
4,380,932 A *  4/1983  Mott et al. ...................... 73/749
(Continued)

FOREIGN PATENT DOCUMENTS

EP    0262507 A2    4/1988
FR    1 247 980 A   12/1960
(Continued)

OTHER PUBLICATIONS

French Report dated Jan. 12, 2011 for French Application No. FR 1054348.
(Continued)

*Primary Examiner* — Lisa Caputo
*Assistant Examiner* — Jonathan Dunlap
(74) *Attorney, Agent, or Firm* — Knobbe, Martens, Olson & Bear, LLP

(57) ABSTRACT

A device forming a pressure sensor is provided. The device includes: a substrate made of electrical insulation material including a first reservoir, a second reservoir in communication with the first reservoir and of which two internal walls are each equipped with an electrode, and a flexible membrane made of an electrical insulation material, including a protuberance and secured to the substrate so as to enable movement of the protuberance between a position in which it is at a distance from a liquid filling the first reservoir and at least one second position in which it exerts a pressure on the liquid, thus discharging it at least partially from the first reservoir toward the second reservoir with mechanical contact with the two electrodes, the mechanical contact of the liquid with the electrodes establishing a resistance or capacitance between the electrodes. Application in the production of a touch screen is also provided.

22 Claims, 8 Drawing Sheets

(51) Int. Cl.
*G01L 9/12* (2006.01)
*G01L 9/00* (2006.01)
*G06F 3/041* (2006.01)
*G06F 3/045* (2006.01)
*H01H 29/18* (2006.01)
*H03K 17/96* (2006.01)

(52) U.S. Cl.
CPC ........... *G01L 9/0095* (2013.01); *G06F 3/0414* (2013.01); *G06F 3/044* (2013.01); *G06F 3/045* (2013.01); *H01H 29/18* (2013.01); *H03K 17/962* (2013.01); *H03K 17/9645* (2013.01)

(56) References Cited

U.S. PATENT DOCUMENTS

| | | | |
|---|---|---|---|
| 4,754,647 A | | 7/1988 | Clarke |
| 4,823,619 A | * | 4/1989 | D'Antonio et al. ...... 73/862.581 |
| 4,987,783 A | * | 1/1991 | D'Antonio et al. ......... 73/432.1 |
| 6,122,972 A | | 9/2000 | Crider |
| 7,538,760 B2 | | 5/2009 | Hotelling et al. |
| 8,179,375 B2 | * | 5/2012 | Ciesla et al. ................... 345/173 |
| 8,179,377 B2 | * | 5/2012 | Ciesla et al. ................... 345/173 |
| 2004/0029425 A1 | | 2/2004 | Yean et al. |
| 2008/0037197 A1 | | 2/2008 | Casset |
| 2008/0060441 A1 | | 3/2008 | Toyoda |
| 2009/0273577 A1 | | 11/2009 | Chen et al. |

FOREIGN PATENT DOCUMENTS

| | | |
|---|---|---|
| FR | 2428823 A1 | 1/1980 |
| FR | 2876215 A1 | 4/2006 |
| FR | 2 879 471 A1 | 6/2006 |
| GB | 1 165 821 A | 10/1969 |

OTHER PUBLICATIONS

International Search Report issued on Aug. 1, 2011 for International Application No. PCT/EP2011/055435.

* cited by examiner

DEVICE FORMING A PRESSURE SENSOR, METHOD FOR PRODUCING SUCH A SENSOR AND APPLICATION IN THE PRODUCTION OF A TOUCH SCREEN

CROSS REFERENCE TO RELATED APPLICATIONS

This application is the U.S. National Phase of International Application No. PCT/EP2011/055435, filed Apr. 7, 2011, designating the U.S. and published as WO 2011/124647 on Oct. 13, 2011 which claims the benefit of French Patent Application No. 10 52658 filed Apr. 8, 2010.

TECHNICAL FIELD

The invention relates to a device forming a pressure sensor including a substrate made of an electrical insulation material.

The invention also relates to a method for producing such a sensor.

A particularly interesting application covered by the invention is the production of a touch screen.

BACKGROUND

Numerous pressure sensors are currently known. More generally, it is possible to define a pressure sensor as being the element that will make it possible, by mechanical pressure, to deliver an electrical signal that can be used by a control circuit.

Pressure sensors have recently undergone increased development because of their expanded use as part of a touch screen. A touch screen indeed enables a user to accomplish different functions by exerting pressure on an interface panel with a finger or a stylus in a precise area indicated by a graphic and/or textual interface. In general, touch screens are thus suitable for recognizing a determined pressure in a determined area of the interface panel, and a control circuit connected to a software processing system of the electrical signal can thus interpret the determined pressure in relation to the graphic and/or textural interface area and thus activate desired operations.

It is possible to cite here the various commercial embodiments produced by the Apple company and which concern touch screens including a plurality of pressure sensors making it possible to detect the pressure exerted on a glass plate.

In their touch screen application, pressure sensors can be classified into two different categories.

Resistive-type pressure sensors include two plates each coated with layers or a plurality of pads made of an electrically conductive material and separated from one another by a layer of resistive material. When pressure is exerted on the plate with an exterior interface, the metal conductive pads or layers come into contact by means of the resistive layer, creating a modification in the electrical resistance, this electrical modification in a precise area being used to detect where the pressure has been exerted. In capacitive-type pressure sensors, electrical charges are accumulated on a glass plate with an exterior interface. When pressure is exerted on said plate, an excess capacitance is induced. This excess can be measured. The distribution of a plurality of pressure sensors over the entire surface of the plate makes it possible to determine the coordinates of the area on which the pressure has been exerted.

The inventors thinks that, for different applications, it would be beneficial to have a pressure sensor made using plastic technology, in particular because it enables flexible substrates to be envisaged. In addition, the inventor thinks that increasing the sensitivity of such pressure sensors could be beneficial.

The objective of the invention is therefore to propose a new type of pressure sensor capable of being made using plastic technology and of which the sensitivity can be increased.

Another objective of the invention is to propose a pressure sensor to be used as a basis for a touch screen.

DESCRIPTION OF THE INVENTION

To do this, the invention relates to a device forming a pressure sensor including:

a substrate made of electrical insulation material including a first reservoir, a second reservoir in communication with the first reservoir and of which two internal walls are each equipped with an electrode;

a flexible membrane made of an electrical insulation material, including a protuberance and secured to the substrate so as to enable the movement of the protuberance between a position in which it is at a distance from a liquid filling the first reservoir and at least one second position in which it exerts a pressure on the liquid, thus discharging it at least partially from the first reservoir toward the second reservoir with mechanical contact with the two electrodes, said mechanical contact of the liquid with the two electrodes establishing a resistance or capacitance between the two electrodes.

Owing to the invention, it is possible to produce a pressure sensor on a flexible substrate made of a plastic material, such as polyethylene naphthalate PEN that is highly sensitive.

The response time of such a pressure sensor, i.e. the time that lapses between the moment at which the pressure is exerted on the flexible membrane, typically by a user's finger, and the moment of short-circuit between the two electrodes detected by a control circuit with a software processing unit, is very short. In the case in which the liquid is electrically insulating, it is possible to choose a material with high electrical permittivity, which makes it possible to obtain a high capacitance of the sensor during the short-circuit between the two electrodes.

In the use of a touch screen, and in which it is envisaged that a pressure will be exerted by a user's finger, a volume of the first and second reservoirs of approximately 5 mm$^3$ for the liquid, with a distance between the two electrodes of approximately 1 mm and a voltage applied between the two electrodes of approximately 0.5 volt is suggested.

To further improve the precision of the pressure sensor according to the invention, it is possible to envisage reducing the volume of the first and second reservoirs to 10 mm$^3$.

The pressure sensor according to the invention has a high detection reproducibility: indeed, the volume of liquid transferred (discharged) is an amplitude fixed by the initial volume determined in the substrate, this initial volume being calibrated and remaining constant throughout the lifetime of the sensor.

According to an advantageous embodiment, the electric insulation substrate has a such a thickness that it is flexible.

The electric insulation substrate is preferably made of plastic material, advantageously chosen from the polyethylenes, preferably polyethylene naphthalate (PEN). It can also be chosen among the poliimides, such as Kapton®, the polypropylenes and the polycarbonates.

It is also possible to envisage producing it with ceramic or silica.

Three alternatives can be envisaged for the liquid:

the liquid can be electrically conductive, such as the polyethylenedioxythiophene (PDOT) polymer or polyaniline or an electrolyte: the short-circuit established between the two electrodes then results in a variation in resistance, the liquid can be electrically insulating: the short-circuit established between the two electrodes then results in a variation in capacitance, the liquid can be electrically semiconductive such as the sodium poly(styrene sulfonate) polymer: the short-circuit established between the two electrodes then results in either a variation in resistance or a variation in capacitance according to the conductivity of the liquid.

In other words, by selecting only the conductivity of the liquid, it is possible to produce either a capacitive-type sensor or a resistive-type sensor.

According to an alternative embodiment, the flexible membrane is made of a plastic material, advantageously polyethylene (PE).

According to another embodiment, the membrane is a metal sheet covered with an electric insulation film.

To optimize the discharge of liquid under pressure, the first reservoir preferably has a shape substantially complementary to the protuberance except on a short distance, said short distance enabling the liquid to be discharged from the first reservoir toward the second reservoir when pressure is applied on the protuberance. The latter can thus have a parallelepiped shape.

To simplify production, the first reservoir and the second reservoir are joined, with the second reservoir being above the first reservoir.

The invention also relates to a method for producing a device forming a pressure sensor including the following steps:

a) production of a substrate made of an electric insulation material including a first reservoir and a portion of a second reservoir in communication with the first reservoir, b) metallization of the base of the second reservoir to create a first electrode and a portion of an electrical connection line connected to the first electrode, c) production of a flexible membrane made of an electric insulation material, including a protuberance, d) metallization of the face of the membrane or a layer made of an electric insulation material secured to the membrane on the side of the protuberance so as to create a second electrode and a portion of a second electrical connection line connected to the second electrode, e) filling of a portion of the first reservoir by a liquid, f) securing of the flexible membrane to the substrate so as to have the protuberance opposite the first reservoir and enable the movement thereof between a position in which it is at a distance from the liquid and at least one second position in which it exerts a pressure on the liquid, thus discharging it at least partially from the first reservoir toward the second reservoir defined by the two electrodes, with mechanical contact with them, said mechanical contact of the liquid with the two electrodes establishing a variation in resistance or capacitance between the two electrodes.

To perform step a), it is possible to emboss or etch an electric insulation substrate.

Step c) is preferably performed by molding, embossing or etching.

Advantageously, after step e), a vacuum is created in the portion of the first reservoir not filled with the liquid and in the second reservoir. Producing the vacuum in the portion of the reservoirs not filled with the liquid advantageously makes it possible to prevent the oxidation of the electrodes, and therefore makes it possible to increase the lifetime of a sensor according to the invention. This vacuum step can be performed during step f) of securing the flexible membrane and the substrate.

It is possible to perform step f) by bonding the membrane onto the substrate with alignment. It is also possible to envisage any other technique, such as sealing or welding.

The method described makes it possible to produce one of the two electrodes secured to the membrane: thus, when a pressure is exerted on the membrane, the dimensional characteristics of the second reservoir are also modified. Thus, the measurement of the variation in resistance or capacitance between the two electrodes makes it possible to determine precisely the value of the pressure applied on the membrane.

If the two electrodes are secured to the substrate, the dimensional characteristics of the second reservoir are not modified, and a binary variation in resistance or capacitance is then obtained, that is to say, all-or-nothing, depending on whether or not the mechanical contact between liquid and electrodes is established.

The invention finally relates to a touch screen including a plurality of pressure sensors described above with a single substrate and a single membrane, with the sensors being arranged uniformly over the entire surface according to a defined pitch, one of the two electrodes of each sensor being connected to one of the two electrodes of all of the others of the plurality of sensors by defining lines (Li), the other of the two electrodes of each sensor being connected to the other of the two electrodes of all of the others of the plurality of sensors by defining columns (Col), the lines being connected to an electric potential (L2) and the columns being connected to an electric potential (L1) different from that of the lines.

BRIEF DESCRIPTION OF THE DRAWINGS

Other advantages and features will become clearer in view of the following detailed description, with reference to the following figures, among which:

FIGS. 2A to 7A, and 10A are diagrammatic top views corresponding to FIGS. 2 to 7 and 10 in a cross-section.

DETAILED DESCRIPTION OF CERTAIN ILLUSTRATIVE EMBODIMENTS

It is specified that the terms "lower" and "upper" are to be used in reference to gravity. Thus, a lower electrode is a bottom electrode and an upper electrode is a top electrode.

Figure 1A:
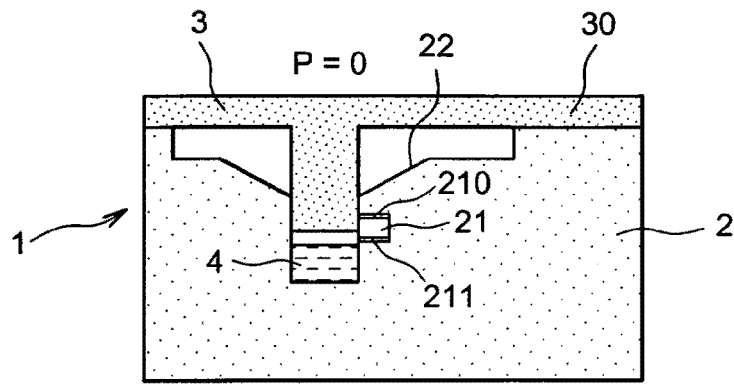
FIGS. 1A and 1B are diagrammatic cross-section views of a pressure sensor according to the invention in a position in which no pressure is applied and in which pressure is applied, respectively.

FIG. 1A shows a device forming a pressure sensor 1 according to the invention in the position in which no pressure (P=0) is exerted above it. The pressure sensor 1 includes a substrate made of an electric insulation material 2 to which a flexible membrane 3 is secured.

The substrate 2 is preferably in the form of a plastic film such as polyethylene naphthalate PEN with a thickness making it flexible (e approximately 125 μm, for example).

The substrate 1 includes a first reservoir 20 partially filled with a liquid 4. A second reservoir 21 is joined to the first reservoir 20 by being arranged above it. This second reservoir 21 includes, on its lower and upper internal walls, two electrodes 210, 211.

The flexible membrane 3 includes a protuberance 30 with a parallelepiped shape as shown in FIG. 1A, with this shape substantially complementary to that of the first reservoir 20 except on a short distance. The membrane is, in the example described, made of polyethylene (PE). The securing of the flexible membrane 3 and the substrate 2 is such that the protuberance is opposite and in line with the first reservoir 20 in the absence of any pressure, and at a distance from the liquid 4 (FIG. 1A).

If pressure is exerted on the membrane 3 (P>O), it will take a position in which the protuberance 30 pushes the liquid by discharging it at least partially from the first reservoir 20 toward the second reservoir 21 with mechanical contact between the two electrodes 210, 211. This mechanical contact of the liquid 4 with the two electrodes 210, 211 establishes a short-circuit between them.

Figure 1B:
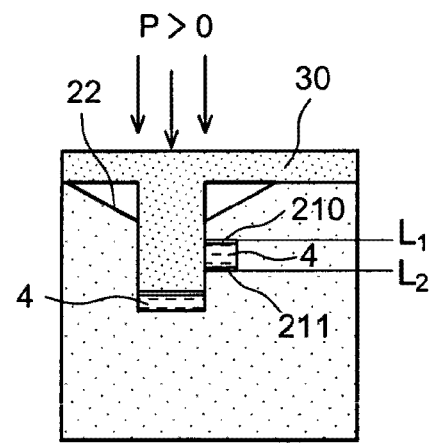
Figure 1C:
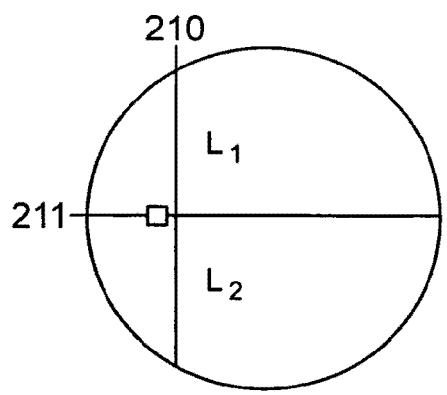
FIG. 1C is a diagrammatic top-view of a pressure sensor according to FIGS. 1A and 1B showing the electrical connections of the two electrodes of the sensor.

Each electrode 210, 211 is connected to an electrical connection line L1, L2 with a different electric potential (FIG. 1C).

The liquid 4 is, in the example described, an electronically conductive polymer such as a polyethylenedioxythiophene (PDOT) or polyaniline.

The pressure sensor shown 1 is a resistive-type pressure sensor because the short-circuit between the two electrodes 210, 211 creates an electrical resistance.

Figure 3:
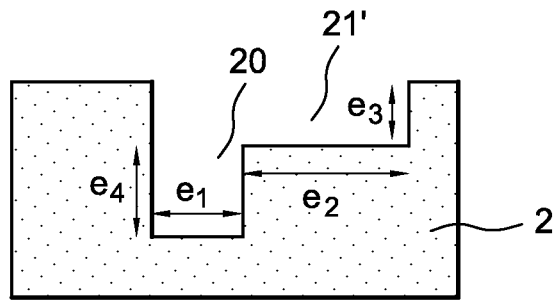
Figure 3A:
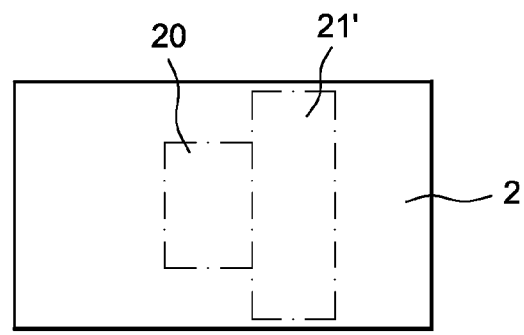
Figure 11:
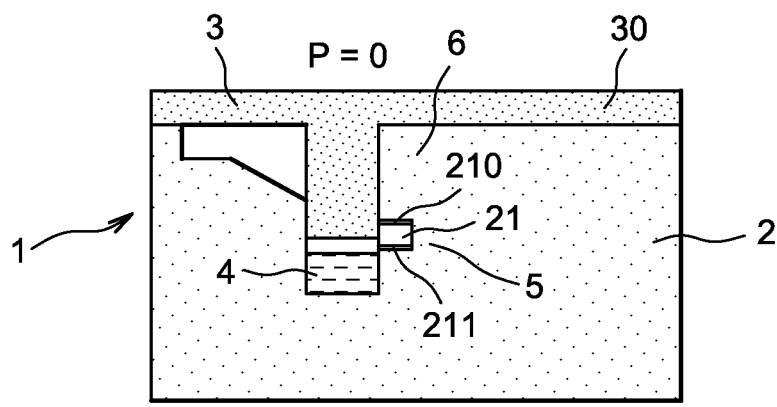

The different steps of production of a pressure sensor according to the invention are shown in FIGS. 3 and 11, and in FIGS. 3A and 11A in corresponding top views.

Figure 2:
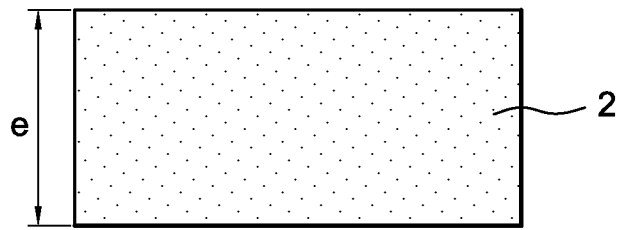
FIGS. 2-7, 8, 10, and 11 are diagrammatic cross-section views showing the different steps of production of a pressure sensor according to the invention.
Figure 2A:
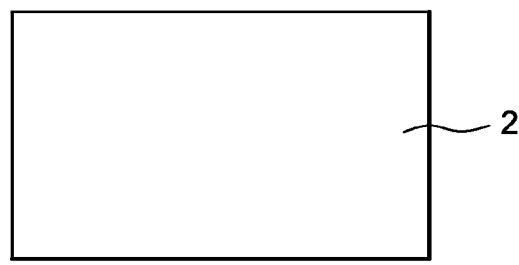

Starting with a substrate 2 made of a flexible material, such as PEN, with a thickness e of approximately 125 μm, for example (FIGS. 2 and 2A), a step of embossing or etching this substrate 2 to obtain the first reservoir 20 and a portion of the second reservoir 21' (FIGS. 3 and 3A) joined to one another is first performed.

For a high-precision sensor, produced by lithographic etching, it is possible for dimensions e1 to e4, as shown in FIG. 3, to be in the following ranges:
  e1 from 1 μm to 3 μm;
  e2 from 1 μm to 3 μm;
  e3 from 100 nm to 1 μm;
  e4 from 100 nm to 1 μm.

Similarly, for a high-precision sensor, produced by embossing, it is possible for dimensions e1 and e4 to be in the following ranges:
  e1 from 10 μm to 500 μm;
  e2 from 1 μm to 500 μm;
  e3 from 100 nm to 10 μm;
  e4 from 1 μm to 100 μm.

It is specified here that dimensions e1 and e4 represent the width and height, respectively of the first reservoir 20, and e2 and e3 represent the width and height, respectively, of the second reservoir 21.

Advantageously, a shape 22 is given to the embodiment of the substrate at the inlet of the first reservoir so as to eliminate any acute angle. As shown in FIGS. 1A and 1B, this shape 22 is a frusto-conical shape. Thus, the membrane 3 of the sensor is not supported on an acute angle when a pressure P is applied: this provides greater flexibility and amplitude. In addition, it makes it possible not to have to damage the membrane prematurely: in other words, its lifetime is thus increased.

Depending on the desired precision of the sensor of the invention and therefore the desired dimensions, one or the other of the techniques (embossing or lithographic etching) will be preferred.

Figure 4:
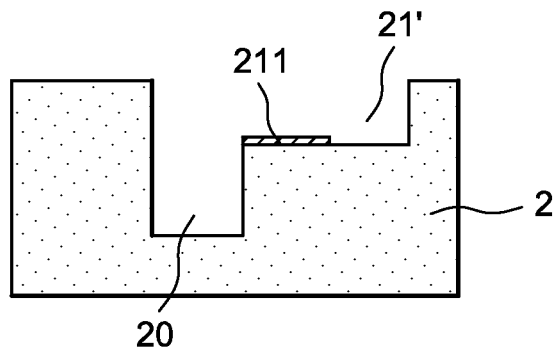
Figure 4A:
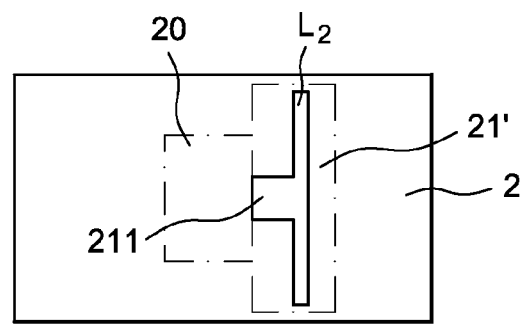

Then, a step of metallization of the base of the reservoir 21' is performed so as to obtain an electrode 211 and an electrical connection line L2 (FIGS. 4 and 4A).

Figure 5:
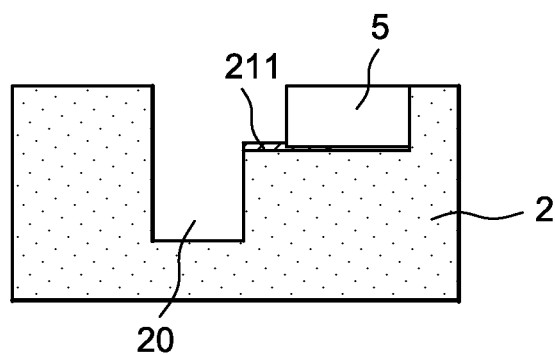
Figure 5A:
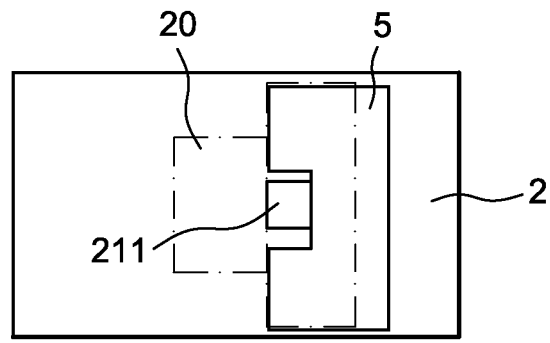

An electric insulation layer is then deposited so as to insulate the electrical connection line from the portion of the second reservoir 21' (FIGS. 5 and 5A).

Figure 6:
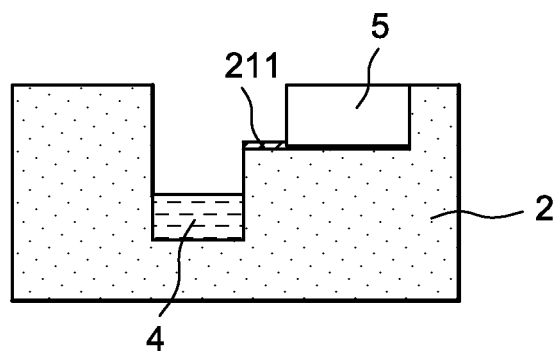
Figure 6A:
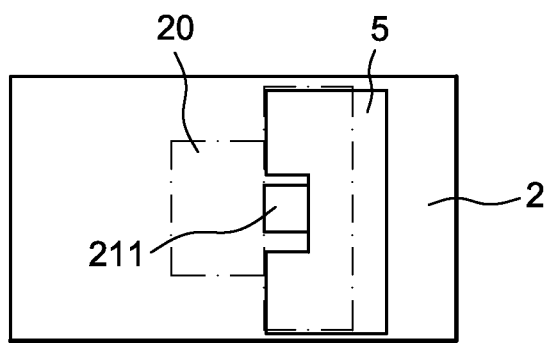

The first reservoir 20 is then filled with liquid 4 in a predetermined amount (FIGS. 6 and 6A). It is an electronically conductive polymer such as a polyethylenedioxythiophene (PDOT) or polyaniline in the example described.

Simultaneously to these steps of producing the flexible PEN substrate 2 described above, the flexible membrane is produced.

Figure 7:
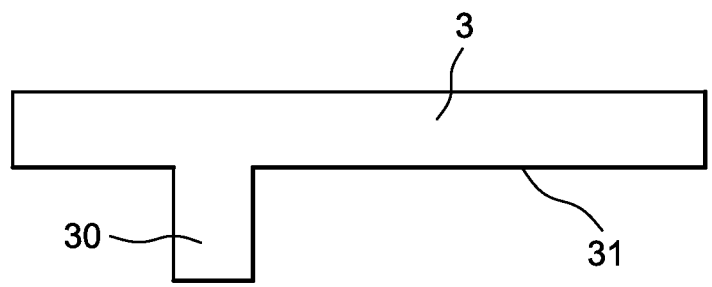
Figure 7A:
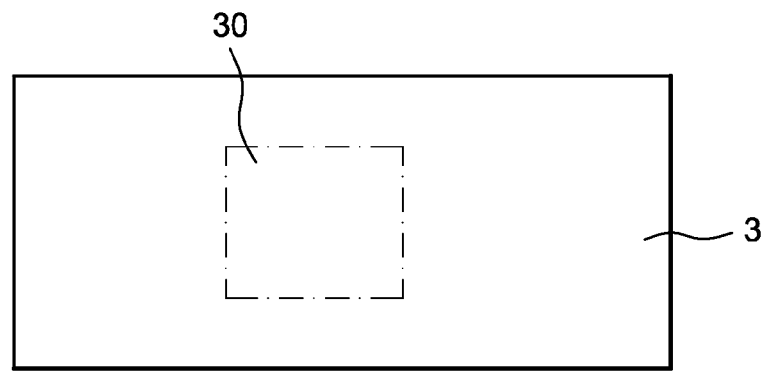

Thus, first, preferably by molding, embossing or etching, a flexible PE membrane 3 is produced with a protuberance 30 having a shape substantially complementary to that of the first reservoir 20 (FIGS. 7 and 7A).

Figure 8:
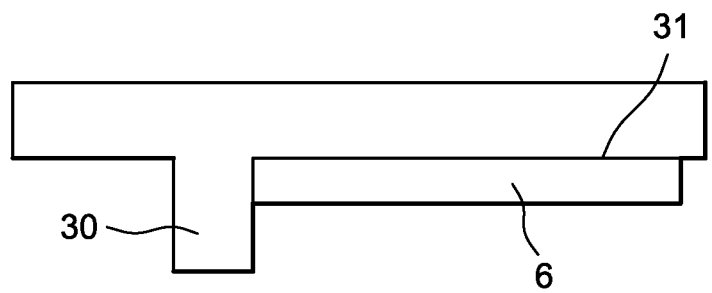

Then, on the side of the face 31 of the protuberance, an electric insulation layer 6 is deposited so as to insulate the metalized electrode 210 afterward (FIG. 8).

Figure 9A:
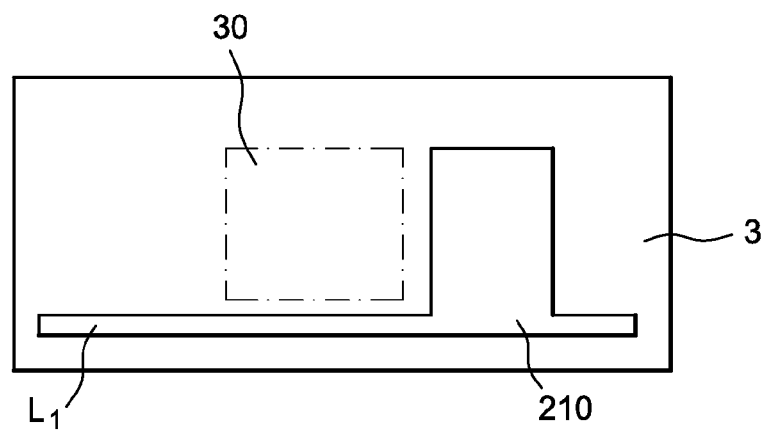
FIG. 9A shows a diagrammatic top view showing a step of production of a pressure sensor according to the invention.

Then, the actual metallization step is performed on the electric insulation layer 6 so as to obtain the second electrode 210 and an electrical connection line L1 (FIG. 9A).

Figure 10:
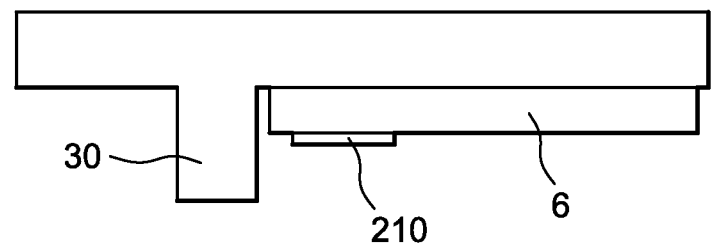
Figure 10A:
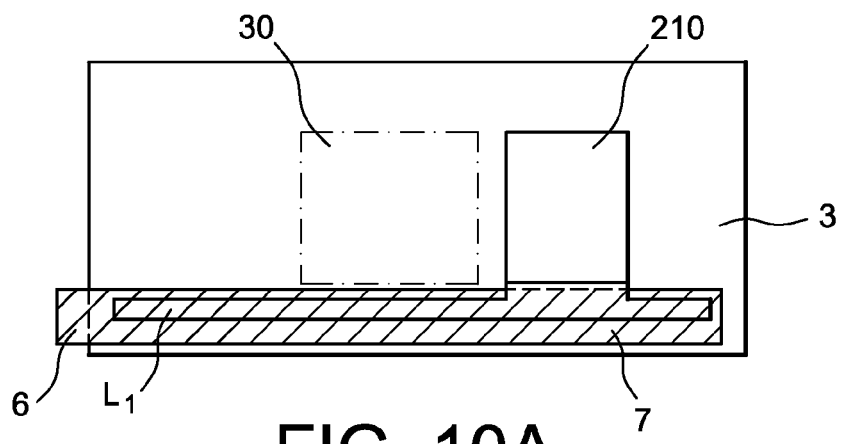

Then, another insulating layer 7 is deposited so as to electrically insulate the electrical connection line L1 (FIGS. 10 and 10A).

Once the flexible substrate has been produced and the first reservoir has been partially filled with liquid 4 (FIGS. 6 and 6A) and the flexible membrane has been produced (FIGS. 10 and 10A), then a step of securing the membrane 3 on the substrate 2 with an alignment so as to position the protuberance 30 opposite and in line with the first reservoir 20 and the two electrodes 210 and 211 opposite one another, is performed (FIG. 11).

In the example shown, the liquid volume filling the first reservoir 20 is approximately 5 mm³. Depending on the precision and dimensions e1 to e4 chosen, it is possible to determine a liquid volume of between 100 pL and 10 mm³. During the step of securing (assembly) the membrane and the substrate, the portion of the first 20 and second 21 reservoirs is placed under vacuum: thus, the oxidation of electrodes 210, 211 is avoided, and the lifetime of the sensor according to the invention is therefore increased.

Figure 12:
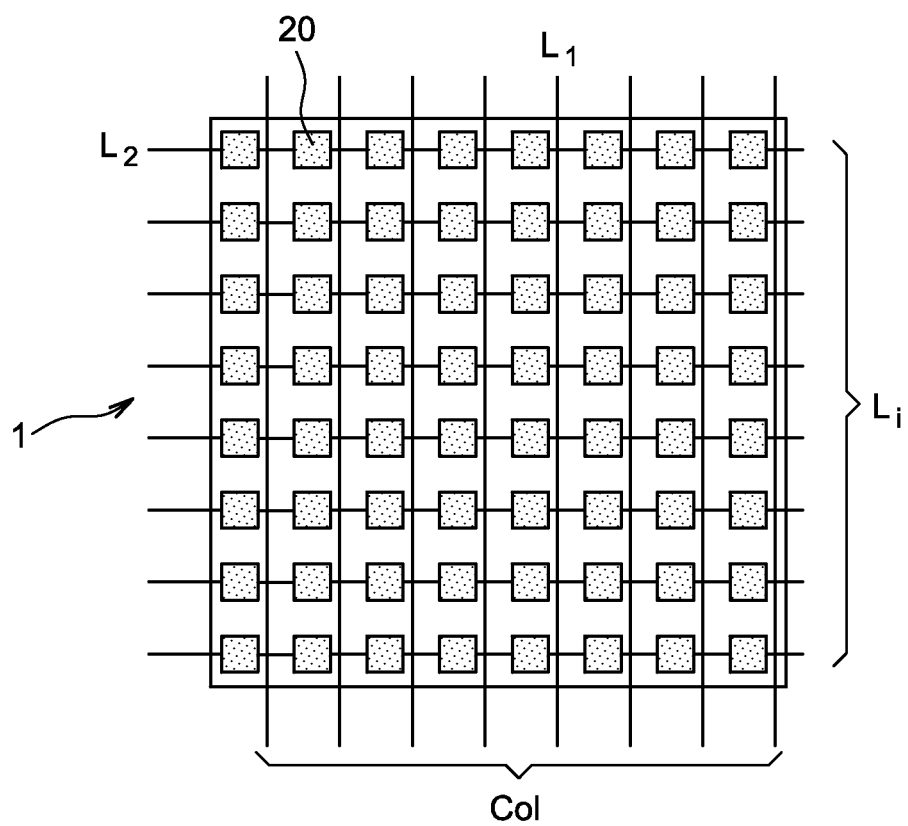
FIG. 12 is a diagrammatic top view of a touch screen including a plurality of pressure sensors according to the invention arranged according to a matrix with a regular defined pitch.

To produce a touch screen, a plurality of pressure sensors are produced with a single substrate 2 and a single membrane 3, with the sensors being arranged uniformly over the entire surface according to a pitch defined as shown in FIG. 12. Thus, one electrode 210 of the two electrodes of each sensor 1 is connected to one electrode 210 of the two electrodes of all of the others of the plurality of sensors by defining geometric lines Li with the electrical connection lines L2. The other electrode 211 of the two electrodes of each sensor is connected to the other electrode 211 of the two electrodes of all of the others of the plurality of sensors by defining geometric columns Col with the electrical connection lines L1.

The lines L2 are connected to an electric potential and the columns L1 are connected to an electric potential different from that of the lines.

In other words, by repeating the structure of the pressure sensor 1 according to the invention over the entire surface of a screen with a defined pitch, it is possible to cover this entire surface and thus pixelate it.

It is thus possible to know precisely whether a pressure has been exerted on the touch screen and in which precise area it has been exerted.

Other improvements and applications can be produced without going beyond the scope of the invention.

Thus, even though the pressure sensor 1 described above is described in reference to the embodiment of a touch screen, it can also be used in another application.

What is claimed is:

1. A pressure sensor device comprising:
   a substrate comprising an electrical insulation material, said substrate further comprising a first reservoir, a second reservoir in communication with the first reservoir and of which two internal walls are each equipped with an electrode;
   a flexible membrane comprising an electrical insulation material, said flexible membrane comprising a protuberance and secured to the substrate so as to enable movement of the protuberance between a position in which it is at a distance from a liquid filling the first reservoir and at least one second position in which it exerts a pressure on the liquid, thus discharging it at least partially from the first reservoir toward the second reservoir with mechanical contact with the two electrodes, said mechanical contact of the liquid with the two electrodes establishing a resistance or capacitance between the two electrodes.

2. The device according to claim 1, wherein said substrate comprising an electric insulation material has such a thickness that it is flexible.

3. The device according to claim 1, wherein said electric insulation material of said substrate comprises a plastic material.

4. The device according to claim 3, wherein said electric insulation material of said substrate is selected from polyethylenes.

5. The device according to claim 3, wherein the electric insulation substrate comprises polyethylene naphthalate (PEN).

6. The device according to claim 1, wherein the liquid is electrically conductive.

7. The device according to claim 1, wherein the liquid is electrically semiconductive.

8. The device according to claim 1, wherein the liquid is electrically insulating.

9. The device according to claim 1, wherein the flexible membrane comprises a plastic material.

10. The device according to claim 9, wherein the flexible membrane comprises polyethylene (PE).

11. The device according to claim 1, wherein the membrane is a metal sheet covered with an electric insulation film.

12. The device according to claim 1, wherein the first reservoir has a shape substantially complementary to the protuberance except on a short distance, said short distance enabling the liquid to be discharged from the first reservoir toward the second reservoir when pressure is applied on the protuberance.

13. The device according to claim 12, wherein the protuberance has a parallelepiped shape.

14. The device according to claim 1, wherein the first reservoir and the second reservoir are joined, with the second reservoir being above the first reservoir.

15. A touch screen comprising:
    a plurality of pressure sensor devices according to claim 1, said touch screen further comprising:
    a single substrate and a single membrane, with the sensors being arranged uniformly over an entire surface according to a defined pitch, one of the two electrodes of each sensor being connected to one of the two electrodes of all of the others of the plurality of sensors by defining lines, the other of the two electrodes of each sensor being connected to the other of the two electrodes of all of the others of the plurality of sensors by defining columns, the lines being connected to an electric potential and the columns being connected to an electric potential different from that of the lines.

16. The device according to claim 1, wherein the liquid is polyethylenedioxythiophene (PDOT) polymer or polyaniline or an electrolyte.

17. The device according to claim 1, wherein the liquid is sodium poly(styrene sulfonate) (PSS) polymer.

18. A method for producing a device forming a pressure sensor comprising:
    a) producing a substrate that comprises an electric insulation material, said substrate comprising a first reservoir and a portion of a second reservoir in communication with the first reservoir,
    b) metallizing a base of the second reservoir to create a first electrode and a portion of an electrical connection line connected to the first electrode,
    c) producing a flexible membrane comprising an electric insulation material, said flexible membrane comprising a protuberance,
    d) metallizing a face of the membrane or a layer comprising an electric insulation material secured to the membrane on a side of the protuberance so as to create a second electrode and a portion of a second electrical connection line connected to the second electrode,
    e) filling a portion of the first reservoir with a liquid,
    f) securing the flexible membrane to the substrate so as to have the protuberance opposite the first reservoir and enable movement thereof between a position in which it is at a distance from the liquid and at least one second position in which it exerts a pressure on the liquid, thus discharging it at least partially from the first reservoir toward the second reservoir defined by the two electrodes, with mechanical contact with them, said mechanical contact of the liquid with the two electrodes establishing a variation in resistance or capacitance between the two electrodes.

19. The method according to claim 18, wherein a) comprises embossing or etching an electric insulation substrate.

20. The method according to claim 18, wherein c) comprises molding, embossing or etching.

21. The method according to claim 18, wherein, after e), a vacuum is created in a portion of the first reservoir not filled with the liquid and in the second reservoir.

22. The method according to claim 18, wherein, f) comprises bonding the membrane onto the substrate with alignment.

* * * * *